(12) United States Patent     (10) Patent No.:    US 8,587,572 B2
Sasaki et al.                                                (45) Date of Patent:     Nov. 19, 2013

(54) STORAGE CAPACITOR LINE DRIVE CIRCUIT AND DISPLAY DEVICE

(75) Inventors: Yasushi Sasaki, Osaka (JP); Yuhichiroh Murakami, Osaka (JP); Makoto Yokoyama, Osaka (JP); Shige Furuta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 689 days.

(21) Appl. No.: 12/734,376

(22) PCT Filed: Aug. 21, 2008

(86) PCT No.: PCT/JP2008/064902
§ 371 (c)(1),
(2), (4) Date: Apr. 28, 2010

(87) PCT Pub. No.: WO2009/084270
PCT Pub. Date: Jul. 9, 2009

(65) Prior Publication Data
US 2010/0245328 A1    Sep. 30, 2010

(30) Foreign Application Priority Data
Dec. 28, 2007    (JP) .................................. 2007-339356

(51) Int. Cl.
*G06F 3/038*       (2013.01)
*G09G 5/00*        (2006.01)
*G09G 3/30*        (2006.01)
*G09G 3/36*        (2006.01)

(52) U.S. Cl.
USPC ................. 345/211; 345/76; 345/90; 345/98; 345/204; 345/205

(58) Field of Classification Search
None
See application file for complete search history.

(56) References Cited

U.S. PATENT DOCUMENTS

| 3,675,043 A | 7/1972 | Bell |
| 4,716,303 A | 12/1987 | Mimoto |

(Continued)

FOREIGN PATENT DOCUMENTS

| CN | 1782834 | 6/2006 |
| CN | 1825415 | 8/2006 |

(Continued)

OTHER PUBLICATIONS

International Search Report.

(Continued)

*Primary Examiner* — Bipin Shalwala
*Assistant Examiner* — Ryan A Lubit
(74) *Attorney, Agent, or Firm* — Harness, Dickey & Pierce, P.L.C.

(57) ABSTRACT

In a storage capacitor line drive circuit driving a storage capacitor line of an active-matrix display device and driven by outputs of a scanning signal line drive circuit, at least one (VSS) of a high-potential supply voltage (VDD) and a low-potential supply voltage (VSS) differs from a supply voltage (GVSS) of a corresponding logical level of the scanning signal line drive circuit, the high-potential supply voltage and the low-potential supply voltage being used for generating a signal voltage of a preceding stage to an output stage. This makes it possible to achieve a storage capacitor line drive circuit capable of avoiding malfunctioning even in a case where the storage capacitor line drive circuit receives noise from a scanning signal line, and a display device including the storage capacitor line drive circuit.

11 Claims, 15 Drawing Sheets

(56) References Cited

U.S. PATENT DOCUMENTS

| | | | |
|---|---|---|---|
| 5,337,173 | A | 8/1994 | Atusmi et al. |
| 5,694,061 | A | 12/1997 | Morosawa et al. |
| 5,701,136 | A | 12/1997 | Huq et al. |
| 5,872,481 | A | 2/1999 | Sevic et al. |
| 5,949,398 | A | 9/1999 | Kim |
| 5,974,041 | A | 10/1999 | Kornfeld et al. |
| 6,052,426 | A | 4/2000 | Maurice |
| 6,064,713 | A | 5/2000 | Lebrun et al. |
| 6,137,315 | A | 10/2000 | Zettler |
| 6,198,342 | B1 | 3/2001 | Kawai |
| 6,225,866 | B1 | 5/2001 | Kubota et al. |
| 6,522,187 | B1 | 2/2003 | Sousa |
| 7,176,746 | B1 | 2/2007 | Wang et al. |
| 7,518,407 | B2 | 4/2009 | Nonaka |
| 7,817,770 | B2 | 10/2010 | Chang et al. |
| 7,983,379 | B2 | 7/2011 | Ieong et al. |
| 8,031,160 | B2 | 10/2011 | Chen et al. |
| 8,059,780 | B2 | 11/2011 | Wang et al. |
| 8,497,833 | B2 | 7/2013 | Park |
| 2002/0084969 | A1 | 7/2002 | Ozawa |
| 2002/0167054 | A1 | 11/2002 | Chang et al. |
| 2004/0141273 | A1 | 7/2004 | Le |
| 2004/0155242 | A1 | 8/2004 | Segawa et al. |
| 2004/0253781 | A1 | 12/2004 | Kimura et al. |
| 2005/0122087 | A1 | 6/2005 | Sakai et al. |
| 2005/0156858 | A1 | 7/2005 | Ahn et al. |
| 2006/0001637 | A1 | 1/2006 | Pak et al. |
| 2006/0103429 | A1 | 5/2006 | Nonaka |
| 2006/0132418 | A1 | 6/2006 | Morita |
| 2006/0152460 | A1* | 7/2006 | Toyozawa et al. ............... 345/98 |
| 2006/0187164 | A1 | 8/2006 | Okuno |
| 2006/0208991 | A1 | 9/2006 | Uekuri et al. |
| 2006/0227096 | A1 | 10/2006 | Fujita |
| 2007/0109288 | A1* | 5/2007 | Kida .............................. 345/211 |
| 2007/0132686 | A1 | 6/2007 | Kimura et al. |
| 2007/0188431 | A1* | 8/2007 | Sato et al. ........................ 345/90 |
| 2007/0217564 | A1 | 9/2007 | Tobita |
| 2008/0056430 | A1 | 3/2008 | Chang et al. |
| 2008/0062071 | A1 | 3/2008 | Jeong |
| 2008/0101529 | A1 | 5/2008 | Tobita |
| 2008/0218620 | A1* | 9/2008 | Atlas et al. .................... 348/308 |
| 2009/0310734 | A1 | 12/2009 | Umezaki |
| 2012/0044132 | A1 | 2/2012 | Koga et al. |
| 2012/0170707 | A1 | 7/2012 | Hsu et al. |
| 2012/0294411 | A1 | 11/2012 | Duan |

FOREIGN PATENT DOCUMENTS

| | | |
|---|---|---|
| CN | 101038792 | 9/2007 |
| EP | 1 199 802 | 4/2002 |
| EP | 1 600 935 | 11/2005 |
| EP | 1 724 784 | 11/2006 |
| EP | 1 780 583 | 5/2007 |
| EP | 1 860 639 | 11/2007 |
| JP | 07-283662 A | 10/1995 |
| JP | 08-23238 A | 1/1996 |
| JP | 08-263028 A | 10/1996 |
| JP | 09-246936 | 9/1997 |
| JP | 10-39277 A | 2/1998 |
| JP | 3092506 | 9/2000 |
| JP | 3092506 B2 | 9/2000 |
| JP | 2001-083943 A | 3/2001 |
| JP | 2004-222256 A | 8/2004 |
| JP | 2005-92783 A | 4/2005 |
| JP | 2006-127751 A | 5/2006 |
| JP | 2006-148269 A | 6/2006 |
| JP | 2006-178072 A | 7/2006 |
| JP | 2006-220947 | 8/2006 |
| JP | 2006-277789 A | 10/2006 |
| JP | 2006-313319 A | 11/2006 |
| JP | 2007-47703 A | 2/2007 |
| RU | 2 175 809 | 11/2001 |
| RU | 2 221 286 | 1/2004 |
| WO | WO 2009/034749 A1 | 3/2009 |
| WO | WO 2009/034750 A1 | 3/2009 |
| WO | WO 2009/084267 A1 | 7/2009 |
| WO | WO 2009/084271 A1 | 7/2009 |

OTHER PUBLICATIONS

Office Action for co-pending U.S. Appl. No. 12/734,044 dated Dec. 7, 2011.
Notice of Allowance for corresponding Russian patent application No. 2010123377 mailed Jul. 15, 2011 (with English translation).
Abstract of JP 9246936 published on Sep. 19, 1997.
Office Action for co-pending U.S. Appl. No. 12/734,363 dated Feb. 21, 2013.
Office Action for corresponding U.S. Appl. No. 12/734,044 dated Apr. 13, 2012.
Advisory Action for corresponding U.S. Appl. No. 12/734,044 dated Jul. 13, 2012.
Notice of Allowance for co-pending U.S. Appl. No. 12/734,044 dated Nov. 13, 2012.
Election of Species Requirement for co-pending U.S. Appl. No. 12/734,595 dated Apr. 30, 2013.
Notice of Allowance mailed on May 31, 2013 for co-pending U.S. Appl. No. 12/734,363.
Office Action for co-pending U.S. Appl. No. 12/734,595 dated Jul. 11, 2013.
Office Action for co-pending U.S. Appl. No. 12/734,044 dated Aug. 26, 2013.

* cited by examiner

F I G. 3
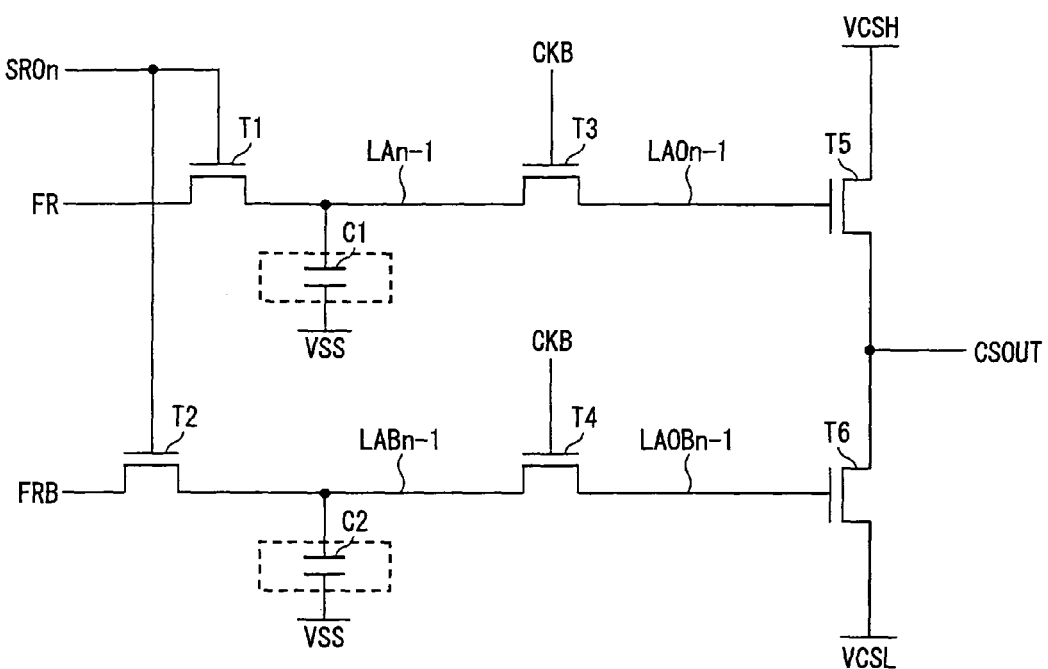

CONVENTIONAL ART

CONVENTIONAL ART

STORAGE CAPACITOR LINE DRIVE CIRCUIT AND DISPLAY DEVICE

TECHNICAL FIELD

The present invention relates to a display device including a storage capacitor line drive circuit.

BACKGROUND ART

In active matrix-type liquid crystal display devices, display is controlled by supplying a data signal to each pixel electrode, thus applying across a liquid crystal layer a voltage between the pixel electrode and a common electrode. The data signal is generated as an AC signal that takes both positive and negative polarities, having a common voltage at the center. However, an amplitude of the data signal is limited by a restriction from a power-supply system and/or a restriction from power consumption. Therefore, the voltage applied to the liquid crystals does not always have a range wide enough to make it possible to achieve a sufficient contrast. Accordingly, liquid crystal display devices performing a capacitive coupling drive has been proposed. The capacitive coupling drive performs upthrusts and downthrusts of a pixel electrode potential by driving a storage capacitor line of each pixel. For example, Patent Literatures 1 to 3 disclose driving methods in each of which the capacitive coupling drive has been further improved.

In some cases, the storage capacitor line drive circuit includes a CS driver (storage capacitor line drive circuit) 104 disposed so that a pixel section 102 is provided between a gate driver (scanning signal line drive circuit) 103 and the CS driver 104, as shown in a liquid crystal display device 101 of (a) of FIG. 8. In other cases, the storage capacitor line drive circuit includes a CS driver (storage capacitor line drive circuit) combined with a gate driver (scanning signal line drive circuit) in a driver 113 disposed in a frame area on one side of an pixel section 112, as shown in a liquid crystal display device 111 of (b) of FIG. 8.

The disposition of the gate driver 103 and the CS driver 104 shown in (a) of FIG. 8 is in accord with narrowing of a frame. In this disposition, the CS driver 104 uses a scan signal in order to read a polarity identification signal FR, and this scan signal is inputted into the CS driver 104 via a gate bus line GL provided in an area of the pixel section 102 after being outputted from the gate driver 103. In contrast, the disposition of the gate driver and the CS driver shown in (b) of FIG. 8 is obtained by incorporating the CS driver into a conventional gate driver. In this disposition, the CS driver receives, from the gate driver within the driver 113, a scan signal that the CS driver uses for reading a polarity identification signal FR.

CITATION LIST

Patent Literature 1

Japanese Patent Application Publication, Tokukai, No. 2007-47703 A (Publication Date: Feb. 22, 2007)

Patent Literature 2

Japanese Patent Application Publication, Tokukai, No. 2006-313319 A (Publication Date: Nov. 16, 2006)

Patent Literature 3

Japanese Patent Application Publication, Tokukaihei, No. 10-39277 A (Publication Date: Feb. 13, 1998)

SUMMARY OF INVENTION

However, in a liquid crystal display device 101 shown in (a) of FIG. 8, a CS driver 104 receives a scan signal from a gate driver 103 via a gate bus line GL as shown in FIG. 14. As a result, the CS driver 104 tends to suffer noise transmission that is from a source bus line SL and that occurs because the gate bus line GL crosses the source bus line SL driven by a source driver 105. Then, because such a liquid crystal display device is configured by a circuit using TFTs of a single polarity and each of the TFTs is made from a material such as amorphous silicon or polycrystal silicon and has only an n-channel-polarity or a p-channel-polarity, many floating spots are produced. In such a case where there are many floating spots, a mechanism as shown on FIG. 15 works. Consequently, electric charges of the floating spots are discharged, which triggers a malfunction of a circuit subsequently connected. In an active matrix display device, noise is generated as a result of a change in potential of a source bus line caused by writing of video data or the like and the noise is imposed to a gate line. In addition, because an output of the gate driver is set to Low for a most part of an output period of the gate driver, almost all gate lines are connected electrically to a Low voltage-supply of the gate driver via a transistor. As a result, the noise that occurs on a gate line is transmitted to the Low voltage-supply of the gate driver. This causes a problem such that the gate line and the Low voltage-supply of the gate driver each of which has noise trigger the discharge mentioned above at the floating spots of a circuit to which the gate line and the Low voltage-supply are connected. Accordingly, noise transmission is likely to occur in a case where the CS driver is electrically connected through the gate bus line GL to a voltage-supply line, the gate line or the like.

Further, the gate driver 103 and the CS driver 104 have an identical potential of a low-potential supply in the case of an n polarity or an identical potential of a high-potential supply in the case of a p polarity. In other words, because the gate driver 103 and the CS driver 104 have an equal High logical level and an equal Low logical level, a noise level for the CS driver 104 is likely to be an active logical level.

Accordingly, there is a risk that the CS driver 104 might store an erroneous polarity signal, because of entry of noise into the CS driver 104 in a period in which the gate bus line GL is set to an OFF potential of the scan signal. As an example, (a) of FIG. 9 shows a condition where the gate bus line GL is connected to a gate of an n-channel TFT 201 used as an analog switch for taking in a polarity identification signal FR. In this condition, when voltage supplies of the gate driver 103 have voltages of 10 V and −5 V and voltage supplies of the CS driver 104 have the same voltages as shown in (b) of FIG. 9, noise on the gate bus line GL turns on the TFT 201 and causes an erroneous change in a memory circuit output OUT of the polarity identification signal FR. As a result, the CS driver 104 malfunctions.

Further, in the liquid crystal display 111 shown in (b) of FIG. 8, noise enters inside the CS driver through a route shown in FIGS. 10 to 13. As a result, the CS driver malfunctions.

In FIG. 10, the driver 113 includes a stage 113a corresponding to each gate bus line GL. The stage 113a includes a shift register stage 113b and a CS driver stage 113b. The shift register stage 113a sets up the gate driver, and the CS driver stage 113c sets up the CS driver. Noise having transmitted from a source bus line SL to the gate bus line GL on the pixel section 112 is transmitted, inside the stage 113a, from the gate bus line GL to an input of the CS driver stage 113c. As a result, the CS driver malfunctions and outputs an erroneous signal to a CS line CSOUT.

FIG. 11 shows a configuration in which an input of a CS driver stage 113c is separated from the gate bus line GL. However, in this case as well, as shown in FIG. 12, noise on the gate bus line GL is mixed into a shift output SRout of the shift register stage 113*b* from a gate driver via a GVSS supply (which is a low-potential supply in the case of an n polarity). Then, the noise is transmitted to the input of the CS driver. As a result, the CS driver malfunctions and outputs an erroneous signal to the CS line CSOUT.

FIG. 13 shows a noise transmission route inside the shift register stage 113*b* in the above-described case. Noise enters inside the shift register stage 113*b* via a scan signal output terminal out from the gate bus line GL. Then, after passing through a transistor T3, the noise transmits through a GVSS supply line and subsequently mixes in the shift output SRout via a transistor T9.

In this way, a conventional liquid crystal display device including a CS driver had a problem such that the CS driver received noise from a gate bus line and malfunctioned.

The present invention is attained in view of the above problems. An object of the present invention is to realize (i) a storage capacitor line drive circuit capable of avoiding malfunctioning even in a case where the storage capacitor line drive circuit receives noise from a scanning signal line, and (ii) a display device including the storage capacitor line drive circuit.

In order to solve the above problems, a storage capacitor line drive circuit in accordance with the present invention drives a storage capacitor line of an active-matrix display device and driven by outputs of a scanning signal line drive circuit, the storage capacitor line drive circuit including as transistors a plurality of transistors having an identical conductivity type, wherein at least one of a high-potential supply voltage and a low-potential supply voltage differs from a supply voltage of a corresponding logical level of the scanning signal line drive circuit, the high-potential supply voltage and the low-potential supply voltage being used for generating a signal voltage of a preceding stage to an output stage.

With the above invention, because at least one of the high-potential supply voltage and the low-potential supply voltage used for generating a signal voltage of a preceding stage to an output stage differs from the supply voltage of the scanning signal line drive circuit, it is possible to prevent noise from disturbing the logical level of the storage capacitor line drive circuit even in a case where the noise on the scanning signal line drive circuit from a data signal line enters inside the storage capacitor line drive circuit. This makes it possible to prevent the storage capacitor line drive circuit from malfunctioning.

With the above, it is possible to achieve a storage capacitor line drive circuit capable of avoiding malfunctioning even in a case where the storage capacitor line drive circuit receives noise from a scanning signal line.

In order to solve the above problems, in the storage capacitor line drive circuit in accordance with the present invention, all the transistors are n-channel-polarity transistors.

In a case where the transistors included in the storage capacitor line drive circuit are all n-channel-polarity transistors, such as in the case of a storage capacitor line drive circuit built into a display panel, many floating spots are produced. Accordingly, with the invention as above, such a difference in supply voltage between the storage capacitor line drive circuit and the scanning signal line drive circuit is very effective for preventing a noise-induced malfunction.

In order to solve the above problems, in the storage capacitor line drive circuit in accordance with the present invention, the low-potential supply voltage for generating the signal voltage of the storage capacitor line drive circuit is higher than a low-potential supply voltage for generating an output of the scanning signal line drive circuit.

With the invention as above, because the low-potential supply voltage for generating the signal voltage of the storage capacitor line drive circuit is higher than a low-potential supply voltage for generating an output of the scanning signal line drive circuit, it is particularly possible to prevent a noise-induced erroneous recognition of a logical Low as a logical High.

In order to solve the above problems, in the storage capacitor line drive circuit in accordance with the present invention, all the transistors are p-channel-polarity transistors.

In a case where the transistors included in the storage capacitor line drive circuit are all p-channel-polarity transistors, such as in the case of a storage capacitor line drive circuit built into a display panel, many floating spots are produced. Accordingly, with the invention as above, such a difference in supply voltage between the storage capacitor line drive circuit and the scanning signal line drive circuit is very effective for preventing a noise-induced malfunction.

In order to solve the above problems, in the storage capacitor line drive circuit in accordance with the present invention, the high-potential supply voltage for generating the signal voltage of the storage capacitor line drive circuit is lower than a high-potential supply voltage for generating an output of the scanning signal line drive circuit.

With the invention as above, because the high-potential supply voltage for generating the signal voltage of the storage capacitor line drive circuit is lower than a high-potential supply voltage for generating an output of the scanning signal line drive circuit, it is particularly possible to prevent a noise-induced erroneous recognition of a logical High as a logical Low.

In order to solve the above problems, the storage capacitor line drive circuit in accordance with the present invention comprises stages corresponding to each of the outputs of the scanning signal line drive circuit, each of the stages including a first switch, a first memory circuit, a first transfer switch, a first analog switch, a second switch, a second memory circuit, a second transfer switch, and a second analog switch, the first analog switch and the second analog switch being included in the output stage, the first switch being provided between the first memory circuit and an input terminal for a first polarity determination signal instructing a polarity of a storage capacitor voltage, the first switch turning on and off according to one of the outputs as a control signal, the one of the outputs being from the scanning signal line drive circuit corresponding to one of the stage, the first memory circuit storing the first polarity determination signal taken in through the first switch and outputting as a first stored signal the first polarity determination signal, the first transfer switch transferring as a first transferred signal the first stored signal outputted from the first memory circuit, in accordance with a timing of a clock signal inputted; the first analog switch being provided between an output terminal to the storage capacitor line of the one of the stages and a high-potential supply of the storage capacitor voltage, the first analog switch turning on and off according to the first transferred signal as a control signal, the first transferred signal being transferred from the first transfer switch, the second switch being provided between the second memory circuit and an input terminal for a second polarity determination signal having a polarity opposite to that of the first polarity determination signal instructing the polarity of the storage capacitor voltage, the second switch turning on and off according to the one of the outputs as a control signal, the one of the outputs being from the scanning signal line drive circuit corresponding to the one of the stage, the second memory circuit storing the second polarity determination signal taken in through the second switch and outputting as a second stored signal the second polarity determination signal, the second transfer switch transferring as a second transferred signal the second stored signal outputted from the second memory circuit, in accordance with the timing of the clock signal inputted, the second analog switch being provided between the output terminal of the one of the stages and a low-potential supply of the storage capacitor voltage, the second analog switch turning on and off according to the second transferred signal as a control signal, the second transferred signal being transferred from the second transfer switch, each of the first polarity reversal signal, the first stored signal, the first transferred signal, the second polarity reversal signal, the second stored signal and the second transferred signal having a voltage of the signal voltage.

With the invention as above, the storage capacitor line drive circuit can reverse without malfunctioning a polarity of a storage capacitor voltage that is to be outputted to a corresponding storage capacitor line every time each output of the scanning signal line drive circuit becomes active.

In order to solve the above problems, in the storage capacitor line drive circuit in accordance with the present invention, the first switch and the second switch are transistors.

With the invention as above, it becomes possible to easily form the first switch and the second switch.

In order to solve the above problems, in the storage capacitor line drive circuit in accordance with the present invention, the first memory circuit is a capacitor connected between (i) an output terminal of the first switch and an input terminal of the first transfer switch on one side and (ii) a low-potential supply of the first stored signal on the other side; and the second memory circuit is a capacitor connected between (i) an output terminal of the second switch and an input terminal of the second transfer switch on one side and (ii) a low-potential supply of the second stored signal on the other side.

With the invention as above, it becomes possible to easily form the first memory circuit and the second memory circuit.

In order to solve the above problems, in the storage capacitor line drive circuit in accordance with the present invention, the first transfer switch and the second transfer switch are transistors turning on and off according to the clock signal as a control signal.

With the invention as above, it becomes possible to easily form the first transfer switch and the second transfer switch.

In order to solve the above problems, a display device in accordance with the present invention includes the storage capacitor line drive circuit.

With the invention as above, it is possible to achieve a storage capacitor line drive circuit capable of avoiding malfunctioning even in a case where the storage capacitor line drive circuit receives noise from a scanning signal line.

In order to solve the above problems, in the display device in accordance with the present invention, the storage capacitor line drive circuit and the scanning signal line drive circuit are formed so as to sandwich the scanning signal line and be separated from each other.

In a display device according to the invention as above, the storage capacitor line drive circuit and the scanning signal line drive circuit are formed so as to have the scanning signal line between the storage capacitor line drive circuit and the scanning signal line drive circuit and so as to be separated from each other. In such a display device, it becomes possible to prevent the storage capacitor line drive circuit from malfunctioning.

In order to solve the above problems, in the display device in accordance with the present invention, both the storage capacitor line drive circuit and the scanning signal drive circuit are formed at one end of the scanning signal line.

In a display device according to the invention as above, both the storage capacitor line drive circuit and the scanning signal drive circuit are formed at one end of the scanning signal line. In such a display device, it becomes possible to prevent the storage capacitor line drive circuit from malfunctioning.

A fuller understanding of the other objects, characteristics and merits of the present invention can be obtained through the ensuing description. Further, the advantages of the present invention will become obvious by referring to the following description taken in conjunction with the accompanying drawings.

BRIEF DESCRIPTION OF DRAWINGS

FIG. 1 is a timing chart of a signal indicative of an operation of a CS driver, in accordance with an embodiment of the present invention.

FIG. 2 is a circuit block diagram illustrating a configuration of the CS driver performing the operation shown in FIG. 1.

FIG. 3

FIG. 3 is a circuit diagram illustrating a concrete example of a configuration of the CS driver shown in FIG. 2.

FIG. 4 is a circuit diagram illustrating a configuration of a gate driver.

FIG. 5 is a timing chart of a signal indicative of an operation of the gate driver shown in FIG. 4.

FIG. 6 is a circuit block diagram illustrating a configuration of a first display device, in accordance with an embodiment of the present invention.

FIG. 7 is a circuit block diagram illustrating a configuration of a second display device in accordance with an embodiment of the present invention.

FIG. 8 illustrates conventional techniques, and (a) and (b) of FIG. 8 are block diagrams each showing a configuration of a display device.

FIG. 9 illustrates a conventional technique, and (a) of FIG. 9 is a circuit diagram showing a first conventional route for noise entry and (b) of FIG. 9 is a wave form chart of a signal on which noise is imposed.

FIG. 10 is a circuit diagram showing a second conventional route for noise entry.

FIG. 11 is a circuit diagram showing a third conventional route for noise entry.

FIG. 12 is a wave form chart of a signal on which noise is imposed via the third route for noise entry.

FIG. 13 is a circuit diagram illustrating in detail the third route for noise entry.

FIG. 14 is a block diagram of a liquid crystal display device illustrating conventional problems.

FIG. 15 is a circuit diagram showing a transmission mechanism of noise for illustrating conventional problems.

REFERENCE SIGNS LIST 1, 11 liquid crystal display device (display device)
4 CS driver (storage capacitor line drive circuit)
13 driver (storage capacitor line drive circuit)
VDD supply voltage (high-potential supply voltage of a scanning signal line drive circuit, high-potential supply voltage for generating a signal voltage of a preceding stage to an output stage in the storage capacitor line drive circuit)
VSS supply voltage (low-potential supply voltage for generating a signal voltage of a preceding stage to an output stage in the storage capacitor line drive circuit)
GVSS supply voltage (low-potential supply voltage of the scanning signal line drive circuit)
VCSH supply voltage (high-potential supply voltage of the storage capacitor line drive circuit)
VCSL supply voltage (low-potential supply voltage of the storage capacitor line drive circuit)

Description of Embodiments

The following explains one embodiment of the present invention, with reference to FIGS. 1 to 7.

Figure 6:
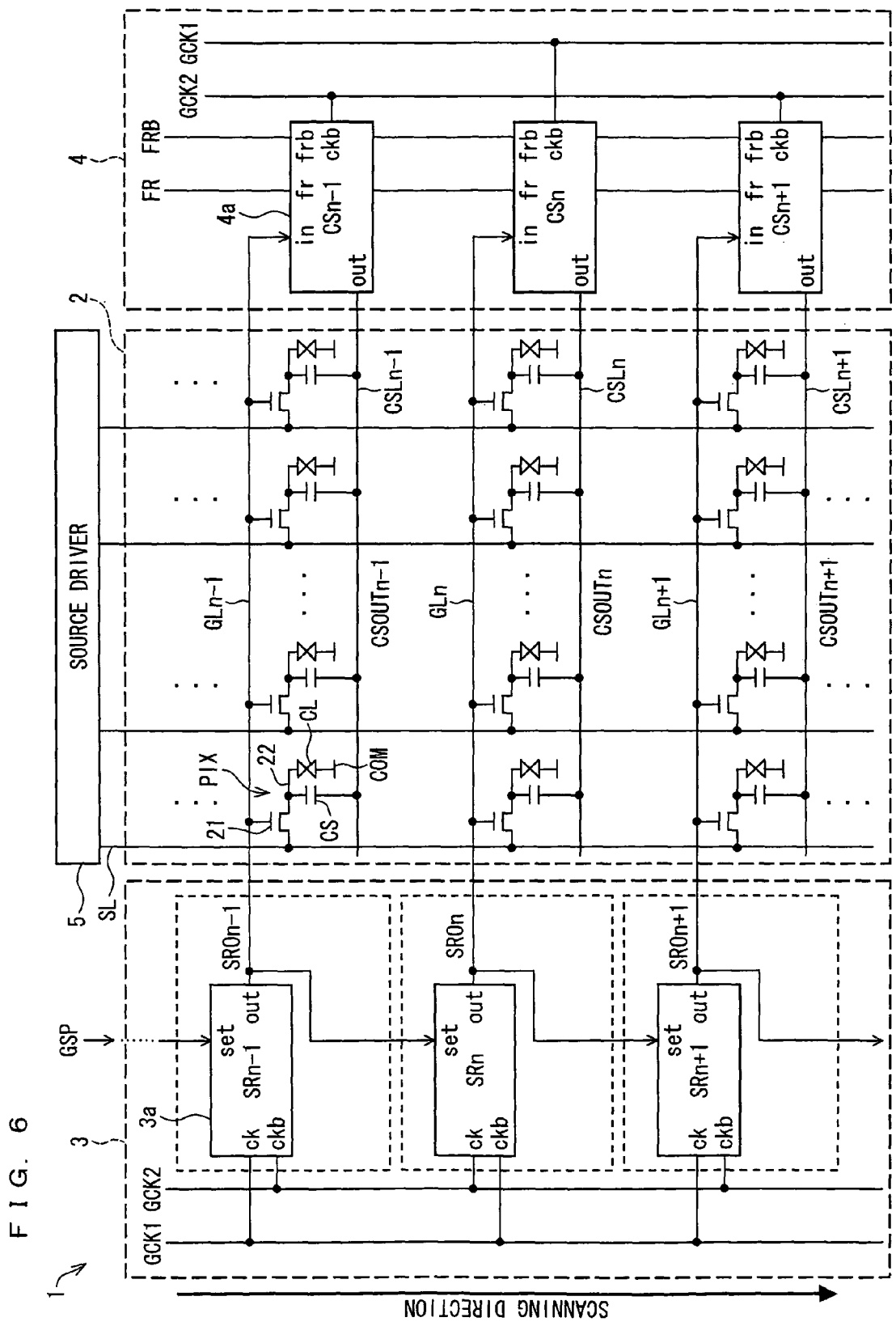
FIG. 6

FIG. 6 shows a configuration of a liquid crystal display device (display device) 1 in accordance with the present embodiment.

The liquid crystal display device 1 is an active-matrix display device and includes a pixel section 2, a gate driver (scan signal line drive circuit) 3, a CS driver (storage capacitor line drive circuit) 4, and a source driver (data signal line) 5. The pixel section 2 and the gate driver 3 are connected by gate bus lines (scan signal lines) GL, and the pixel section 2 and the CS driver 4 are connected by CS bus lines (storage capacitor lines) CSL. Further, the pixel section 2 and the source driver 5 are connected by source bus lines (data signal lines) SL. Every row of the CS bus lines CSL is individually driven.

The pixel section 2 is configured so that a plurality of pixels PIX . . . are disposed in an array. Each pixel PIX includes a TFT 21, a liquid crystal capacitor CL, and a storage capacitor CS. The TFT 21 is a selecting element of each active-matrix type pixel PIX. A gate of the TFT 21 is connected to a gate bus line GL, and a source of the TFT 21 is connected to a source bus line SL. Further, a drain of the TFT 21 is connected to a pixel electrode 22. The liquid crystal capacitor CL is configured so that a liquid crystal layer is provided between the pixel electrode 22 and a common electrode COM. The storage capacitor CS is configured so that an dielectric layer is provided between the pixel electrode 22 and the storage capacitor line CSL.

The gate driver 3 includes a shift register including a plurality of shift register stages 3a . . . in cascade connection. Each shift register stage 3a includes a set input terminal set, an output terminal out and clock input terminals ck and ckb. A $k^{th}$ shift register stage 3a (k=..., n−1, n, n+1 ...) is denoted as SRk, and an output signal outputted from an output terminal out of SRk is denoted as SRoutk. The shift register stage 3a denoted as SRk drives a corresponding gate bus line GLk with use of an output signal SRoutk. A gate start pulse GSP is inputted into a set input terminal set of a first-stage shift register stage 3a. The output terminal out of each shift register stage 3a is connected to a set input terminal set of a next $(k+1)^{th}$ shift register stage 3a. In other words, an output signal SRO outputted from the output terminal out of each shift register stage 3a becomes a set signal of a shift register stage 3a of a next stage.

Further, for either one of shift register stages 3a of odd-numbered stages and shift register stages 3a of even-numbered stages, a gate clock signal GCK 1 is inputted into clock input terminals ck while a gate clock signal GCK 2 is inputted into clock input terminals ckb. Meanwhile, for the other one of the shift register stages 3a of odd-numbered stages and the shift register stages 3a of even-numbered stages, a gate clock signal GCK2 is inputted into clock input terminals ck while a gate clock signal GCK1 is inputted into clock input terminals ckb. The gate clock signal GCK1 and the gate clock signal GCK2 have an identical cycle period, and active periods, i.e. High level periods, of the gate clock signals GCK1 and GCK2 do not overlap each other.

The CS driver 4 is formed so that the gate bus line GL is provided between the CS driver 4 and the gate driver 3, and includes a plurality of CS driver stages 4a in cascade connection. Each CS driver stage 4a includes polarity input terminals fr and frb, a scan signal input terminal in, an output terminal out and a clock input terminal ckb. A $k^{th}$ CS driver stage 4a (k=..., n−1, n, n+1 ...) is denoted as CSk and an output signal outputted from an output terminal of CSk is denoted as CSOUTk. The CS driver stage 4a represented by CSk drives a corresponding CS bus lines CSLk, using the output signal CSOUTk as a storage capacitor voltage.

In each CS driver stage 4a, polarity determination signals FR and FRB are inputted all at once. The polarity determination signal FR has a reversed phase with respect to the polarity determination signal FRB. Further, a gate clock signal is inputted in a clock input terminal ckb of the $k^{th}$ CS driver stage 4a. This gate clock signal is the gate clock signal GCK1 or the gate clock signal GCK2 which is inputted into the clock input terminal ckb of the $k^{th}$ shift register stage 3a A source driver 5 outputs to each of the source bus lines SL a data signal corresponding to display data externally supplied.

In the liquid crystal display device 1 in accordance with the above configuration, all of the pixel section 2, the gate driver 3, the CS driver 4, and the source driver 5 are built on a glass substrate by using amorphous silicon, polycrystal silicon, CG silicon or the like. Further, each of the gate driver 3, the CS driver 4, and the source driver 5 include, as transistors, only a plurality of transistors having an identical conductivity type. In the present embodiment, particularly, all the transistors are made of TFTs having an n-channel-polarity.

Figure 2:
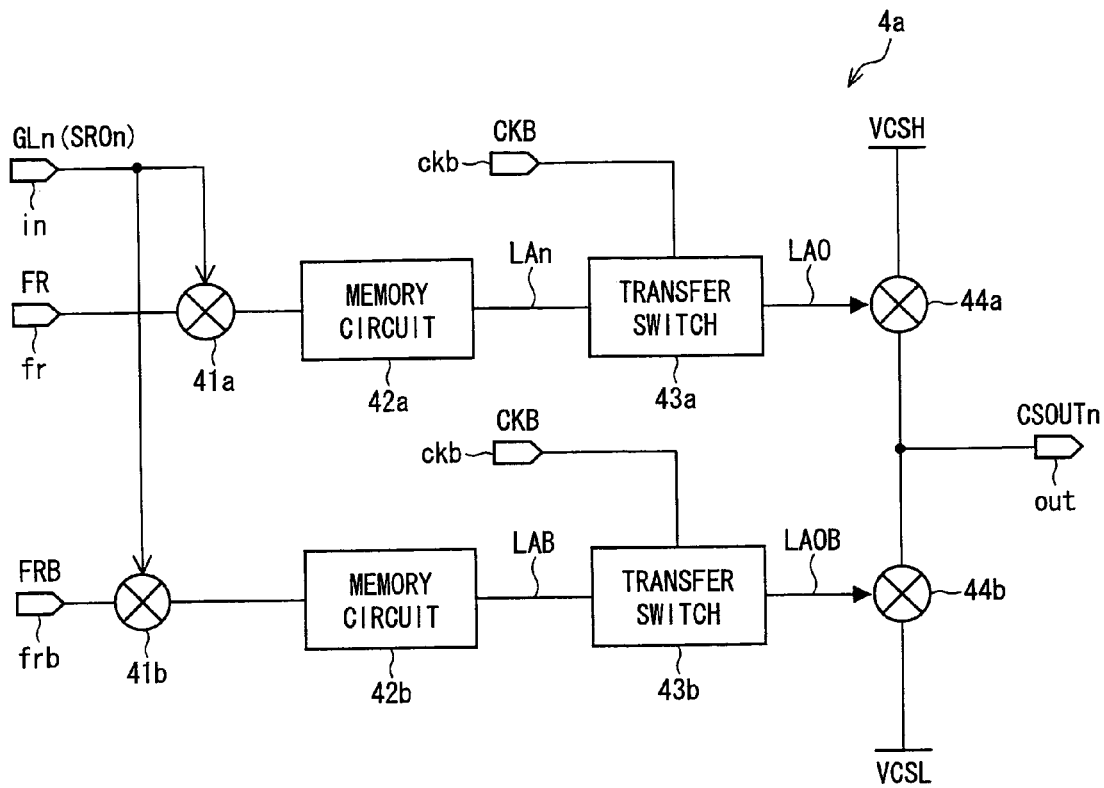
FIG. 2

Next, FIG. 2 is a block diagram illustrating an example of a configuration of each CS driver stage 4a included in the CS driver 4. Further, FIG. 3 is a circuit diagram in which each of the blocks in FIG. 2 is made of a concrete circuit element.

The CS driver stage 4a includes analog switches 41a and 41b, memory circuits 42a and 42b, transfer switches 43a and 43b, and analog switches 44a and 44b. It must be noted that, because FIG. 2 shows as an example an $n^{th}$ CS driver bus stage 4a, a reference sign n is labeled as appropriate. The analog switches 41a, 41b, 44a, and 44b all are made of n-channel-type TFTs, respectively, as shown by transistors T1 to T4 in FIG. 3.

The analog switch 41a is turned on/off according to the output signal SRO (that is the scan signal inputted from the gate bus line GL) as a control signal, and takes into the memory circuit 42a the polarity determination signal FR which is inputted into the polarity input terminal fr. The analog switch 41b, according to the output signal SRO (that is the scan signal inputted from the gate bus line GL) as a control signal, takes into the memory circuit 42b the polarity determination signal FRB which is inputted into the polarity input terminal frb. In FIG. 3, the analog switch 41a is made of the transistor T1, and the output signal SRO is inputted into a gate of the transistor T1. Further, in FIG. 3, the analog switch 41b is made of a transistor T2, and the output signal SRO is inputted into a gate of the transistor T2.

The memory circuit 42a stores the polarity determination signal FR which has been taken in via the analog switch 41a, and outputs a stored signal LA. The memory circuit 42b stores the polarity determination signal FRB, which has been taken in via the analog switch 41b, and outputs a stored signal LB. In FIG. 3, the memory circuit 42a is made of a capacitor C1, and the capacitor C1 is connected between an output terminal of the analog switch 41a and a supply VSS. In FIG. 3, the memory circuit 42b is made of a capacitor C2, and the capacitor C2 is connected between an output terminal of the analog switch 41b and the supply VSS.

The transfer switch 43a transfers, as a transferred signal LAO, the stored signal LA outputted from the memory circuit 42a. The stored signal LA is transferred in line with a timing of the clock signal CKB (that is, CKB1 or CKB2) inputted via the clock input terminal ckb. The transfer switch 43b transfers, as a transferred signal LAOB, the stored signal LAB outputted from the memory circuit 42b. The stored signal LAB is transferred in line with a timing of the clock signal CKB (that is, CKB1 or CKB2) inputted via the clock input terminal ckb. In FIG. 3, the transfer switch 43a is made of a transistor T3, and the clock signal CKB is inputted into a gate of the transistor T3. Further, in FIG. 3, the analog switch 43b is made of a transistor T4, and the clock signal CKB is inputted into a gate of the transistor T4.

A low-potential supply voltage VSS (the reference sign of supply VSS is used as a substitutive expression) is Low of the polarity determination signals FR and FRB, the stored signals LA and LAB and the transferred signals LAO and LAOB. The low-potential supply voltage VSS also can be described as a low-potential supply voltage VSS for generating a signal voltage of a preceding stage to an output stage of the CS driver stage 4a. This low-potential supply voltage VSS has a relation of VSS>VCSL with a low-potential supply voltage VCSL of the CS driver stage 4a at the output stage (i.e. an output stage of the CS driver 4) including the analog switches 44a and 44b. Then, in the present embodiment, the supply voltage VSS is set so as to be higher than a low-potential supply voltage GVSS of the gate driver 3.

The analog switch 44a turns on/off according to the transferred signal LAO, as a control signal, that is transferred from the transfer switch 43a, and thereby outputs, as an output signal CSOUT, the high-potential supply voltage VCSH of the storage capacitor line CSL to the output terminal out. The analog switch 44b turns on/off according to the transferred signal LAOB, as a control signal, that is transferred from the transfer switch 43b, and thereby outputs, as an output signal CSOUT, the low-potential supply voltage VCSL of the storage capacitor line CSL to the output terminal out. In FIG. 3, the analog switch 44a is made of a transistor T5, and the transferred signal LAO is inputted into a gate of the transistor T5. Further, in FIG. 3, an analog switch 44b is made of a transistor T6, and the transferred signal LAOB is inputted into a gate of the transistor T6.

Figure 1:
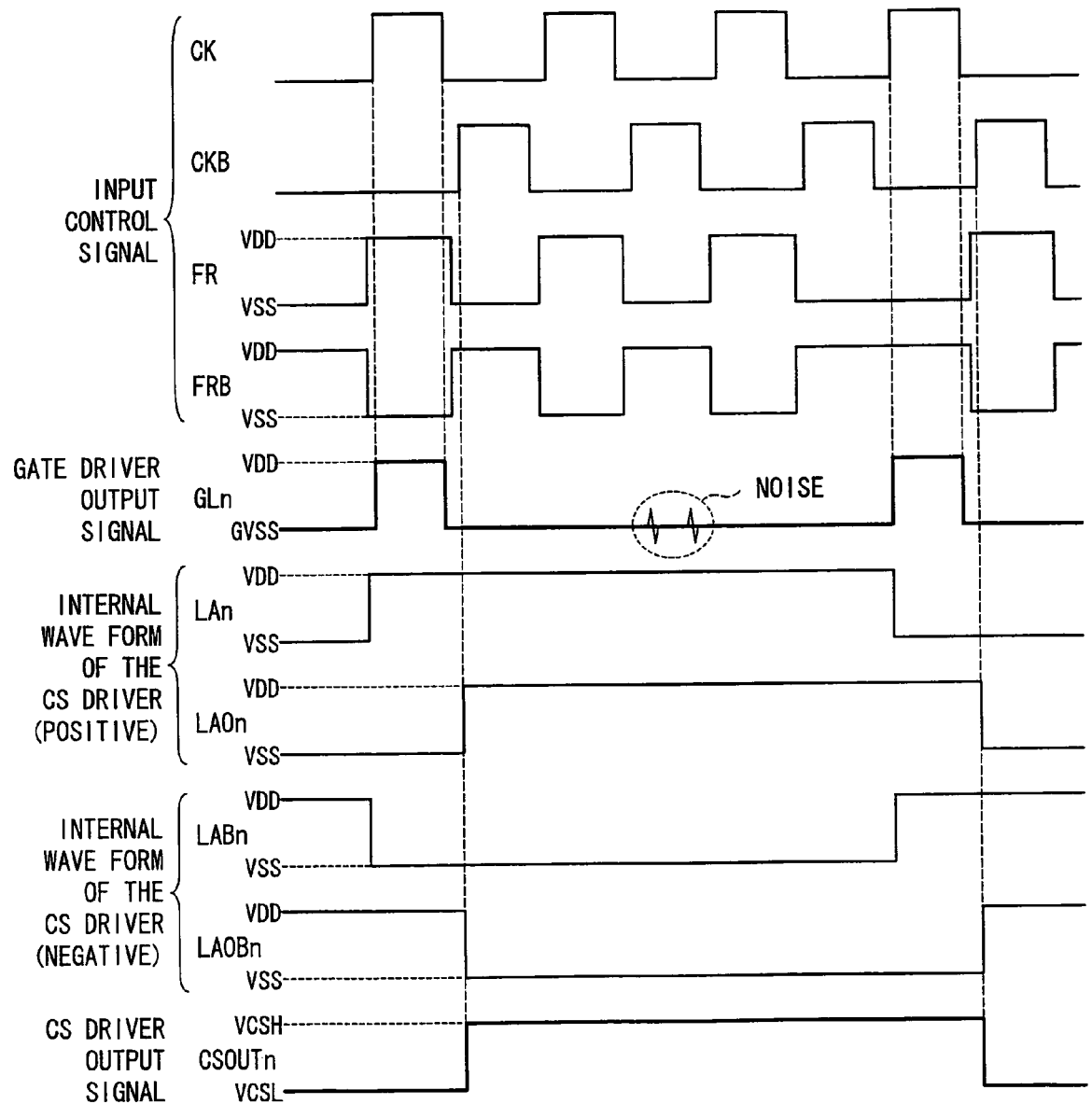
FIG. 1

FIG. 1 shows a timing chart of each signal of the CS driver 4.

As described above, the low-potential supply voltage VSS for generating a signal voltage of a preceding stage to an output stage of the CS driver stage 4a is set higher than the low-potential supply voltage GVSS of the gate driver 3.

In each CS driver stage 4a, the polarity determination signal FR is taken in line with a timing at which a scan signal inputted from the gate bus line GL becomes High. The polarity determination signals FR and FRB switch between High and Low in the identical cycle period as that of the clock signals CK and CKB (i.e. CKB1 and CKB2). A pulse period of each signal is set so that each pulse period of the clock signals CK and CKB is within each pulse period of the polarity determination signals FR and FRB. Further, the polarity determination signal FR is High in a period in which the clock signal CK is High or at an active level, whereas the polarity determination signal FRB is High in a period in which the clock signal CKB is high or at an active level.

When the scan signal enters a High period in a period in which the clock signal CK is at a High level, the analog switch 41a is turned on. Then, the polarity determination signal FR is stored in the memory circuit 42a, and the memory circuit 42a outputs a High signal as a stored signal LA. This High stored signal is retained in one CS driver stage 4, until a High scan signal enters a next High period, that is until the end of one following frame period.

The transfer switch 43a transfers the transferred signal LAO that is High, in line with a timing at which the clock signal CKB becomes High immediately after the above-described period at which the clock signal CK is High, that is one horizontal period after a point at which the clock signal CK becomes High. Because a portion between the transfer switch 43a and a gate of the analog switch 44a becomes floating when the transfer switch 43a is turned off, the transferred signal LAO keeps a voltage constant until the transfer switch 43a is turned on again. The High period of the transferred signal LAO continues, until a rise of the clock signal CBK to High immediately after a turn of the stored signal LA into Low.

The polarity of each signal in a route for entry of the polarity determination signal FRB is opposite to that in a route for entry of the polarity determination signal FR. In other words, the stored signal LAB has a reversed phase to a phase of the stored signal LA, and the transferred signal LAOB has a reversed phase to a phase of the transferred signal LAO.

In this way, in the period in which the transferred signal LAO is High, the analog switch 44a is turned on and the analog switch 44b is turned off. As a result, the output signal CSOUT becomes the supply voltage VCSH at a High level. In contrast, in the period in which the transferred signal LAOB is High, the analog switch 44b is turned on and the analog switch 44a is turned off. As a result, the output signal CSOUT becomes the supply voltage VCSL at a Low level. In this way, a voltage polarity of the CS bus line CSL is reversed for every frame.

The supply voltages VDD and VSS for generating signal voltages of a preceding stage to an output stage of the CS driver stage 4a, are, for example, 10 V and 0 V, respectively.

Here, the low-voltage supply voltage VSS of the CS driver 4 is set higher than the low-voltage supply voltage GVSS of the gate driver 3 (for example −5 V, as described below). This causes a noise level to be unlikely to become as high as a logical High as compared to the power-supply voltage VSS, even if noise from the source bus line SL is imposed to the gate bus line GL and enters inside the CS driver 4. Accordingly, no malfunction of the CS driver 4 is caused by disturbance of the Low signal at a non-active level due to noise which has entered inside the CS driver 4, and the CS driver 4 is able to output a correct output signal CSOUT.

Figure 4:
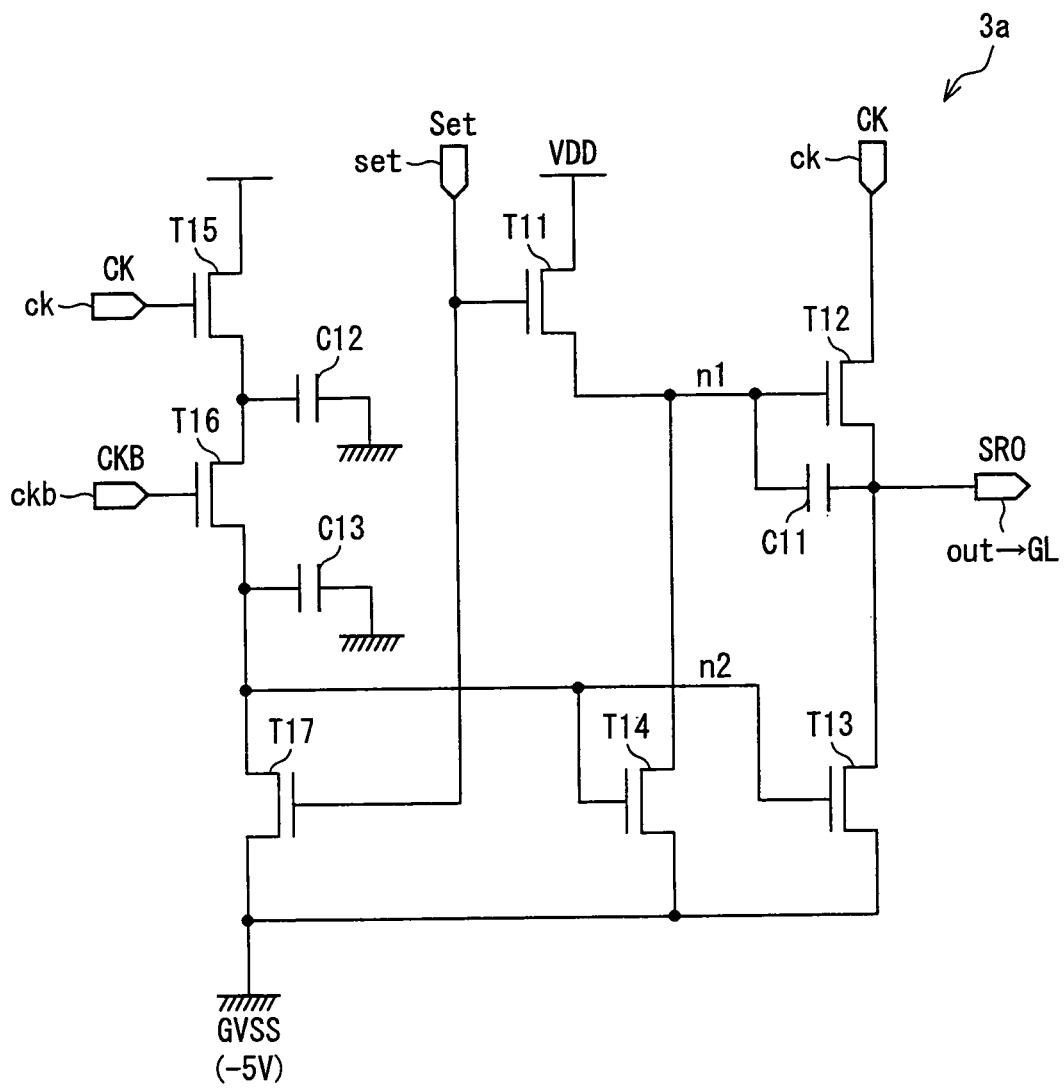
FIG. 4

Next, FIG. 4 illustrates an example of a configuration of each shift register stage 3a included in a gate driver 3.

The shift register stage 3a includes transistors T11 to T17 which are made of n-channel TFTs, and capacitors C11 to C17.

A gate of the transistor T11 is connected to the set input terminal set and a drain of the transistor T11 is connected to the high-potential supply VDD of the gate driver 3. Further, a source of the transistor T11 is connected to a drain of the transistor T14 by a node n1. A gate of the transistor T12 is connected to the node n1 and a drain of the transistor T12 is connected to the clock input terminal ck. Further, a source of the transistor T12 is connected to a drain of the transistor T13 at a connecting point that is the output terminal out of the shift register 3a. Sources of the transistors T13 and T14 are connected to the low-potential supply GVSS of the gate driver 3 and gates of the transistors T13 and T14 are connected to a node n2 explained below. Further, the capacitor C11 is connected between the node n1 and the output terminal out.

A gate of the transistor T15 is connected to the clock input terminal ck and a drain of the transistor T15 is connected to the supply VDD. Further, a source of the transistor T15 and a drain of the transistor T16 are connected to each other. The capacitor C12 is connected between the supply GVSS and a connecting point between the source of the transistor T15 and the drain of the transistor T16. A gate of the transistor T16 is connected to the clock input terminal ckb. Further, a source of the transistor 16 is connected to a drain of the transistor T17 and to the node n2. The capacitor C13 is connected between the node n2 and the supply GVSS.

A gate of the transistor T17 is connected to the set input terminal set and a source of the transistor T17 is connected to the supply GVSS.

A voltage VDD of the supply VDD (the reference sign of supply VDD is used as a substitutive expression) and a voltage GVSS of the supply GVSS (the reference sign of supply GVSS is used as a substitutive expression) are, for example, 10 V and –5 V, respectively.

Figure 5:
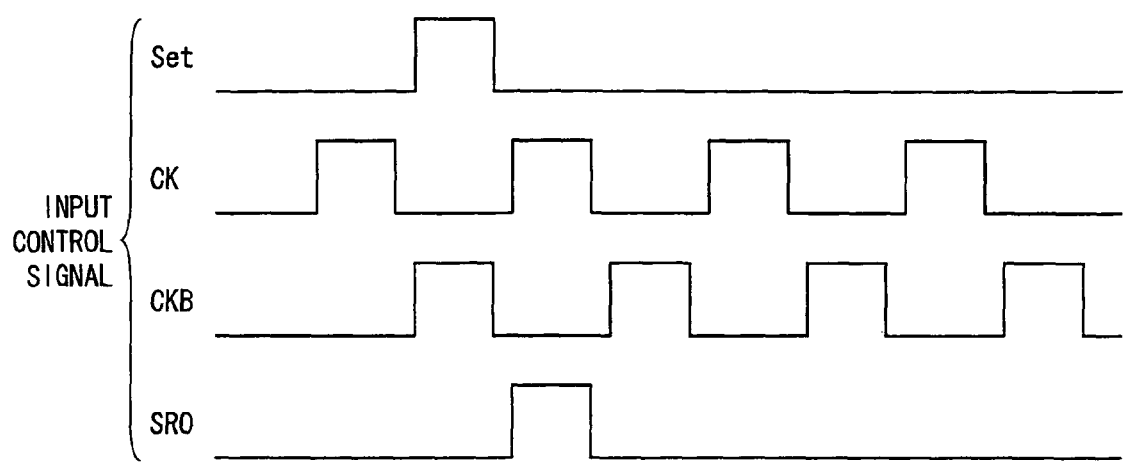
FIG. 5

FIG. 5 is a timing chart of an input control signal used in the shift register stage 3a shown in FIG. 4.

Clock signals CK and CKB (i.e. CK1 and CK2) are the same as those explained based on FIG. 1. When a set signal Set is inputted into the set input terminal set, as illustrated in FIG. 6, in synchronization with a High period of the clock signal CKB, an output signal SRO is outputted from the output terminal out and becomes a scan signal. This output signal SRO enters a High period in the High period of the clock signal CK one horizontal period after the input of the set signal Set. The following briefly explains a circuit operation. As shown in FIG. 4, while the set signal Set is High, the transistors T11, T12 and T17 are on whereas the transistors T13 and T14 are off. As a result, the clock signal CK is outputted as the output signal SRO to the output terminal out. While the clock signal CK is High, the transistor 15 is turned on and charges the capacitor C12 by using the supply voltage VDD. The transistor T16 is turned on while the clock signal CKB is High, and repeatedly charges the capacitor C13 up to the supply voltage VDD by using a voltage of the capacitor C12 during a period in which the set signal Set is Low. When the set signal Set becomes High and the transistor T17 is turned on, the capacitor C13 discharges electricity so as to reach the supply voltage GVSS.

Figure 7:
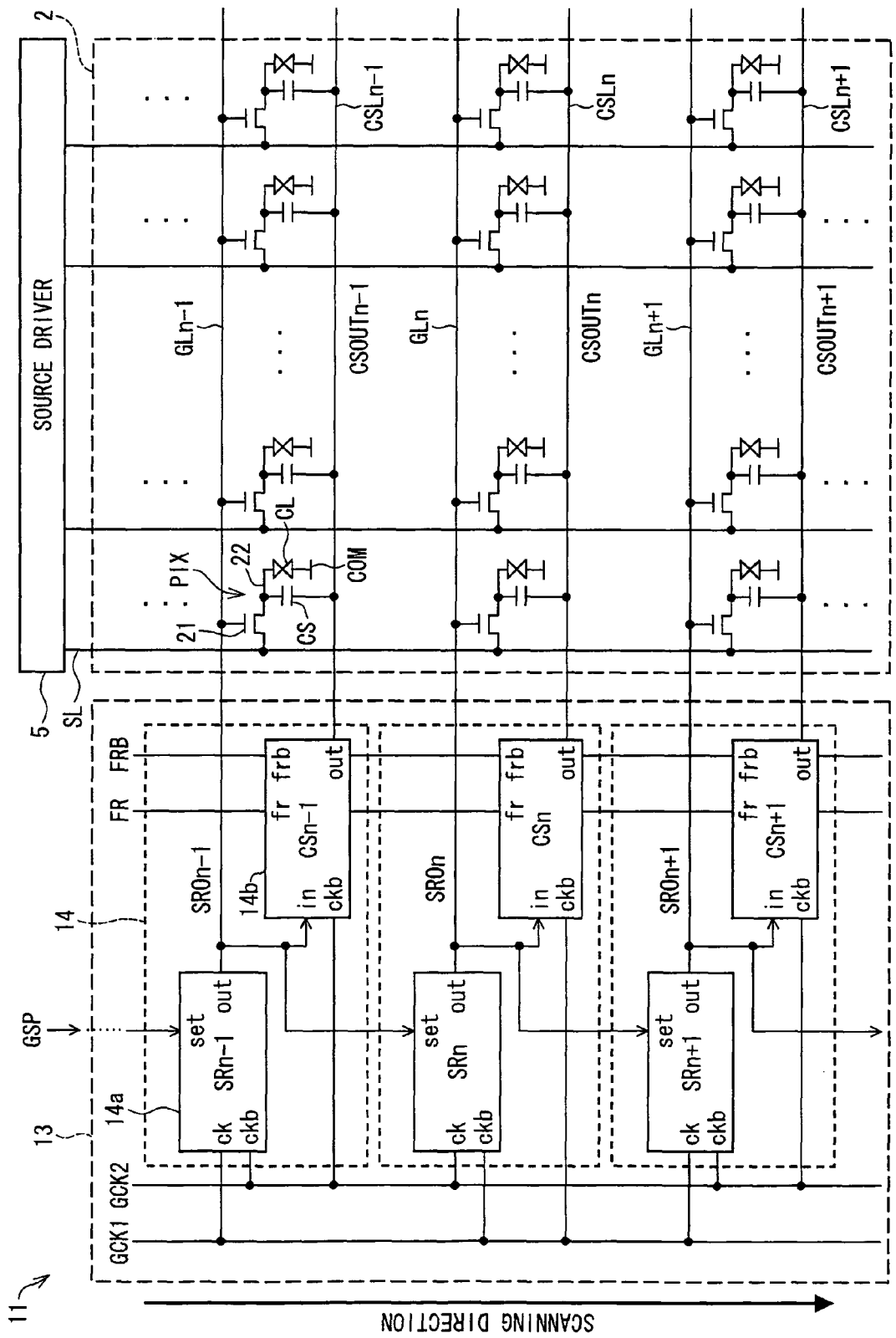
FIG. 7
Figure 8:
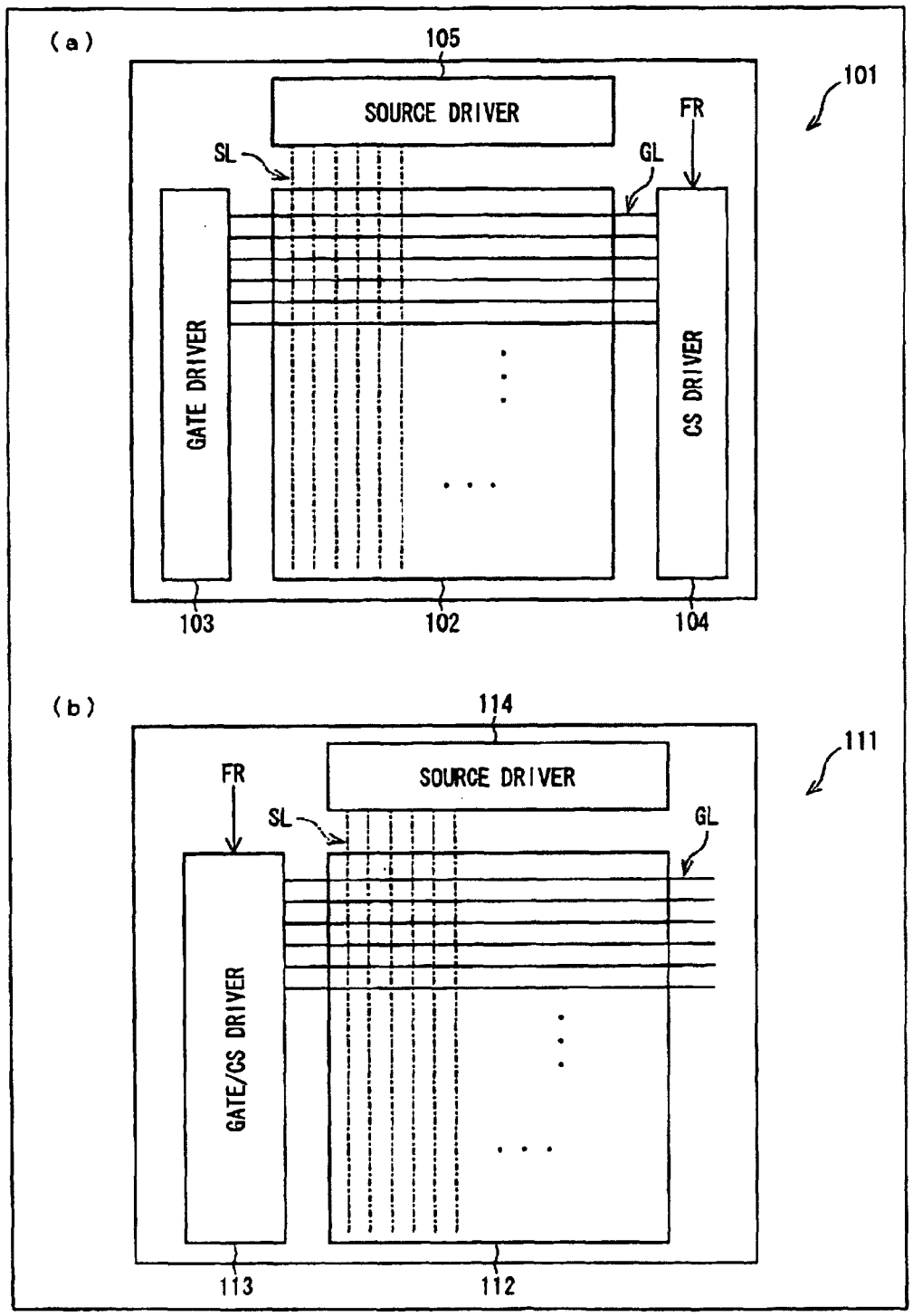
FIG. 8
Figure 9:
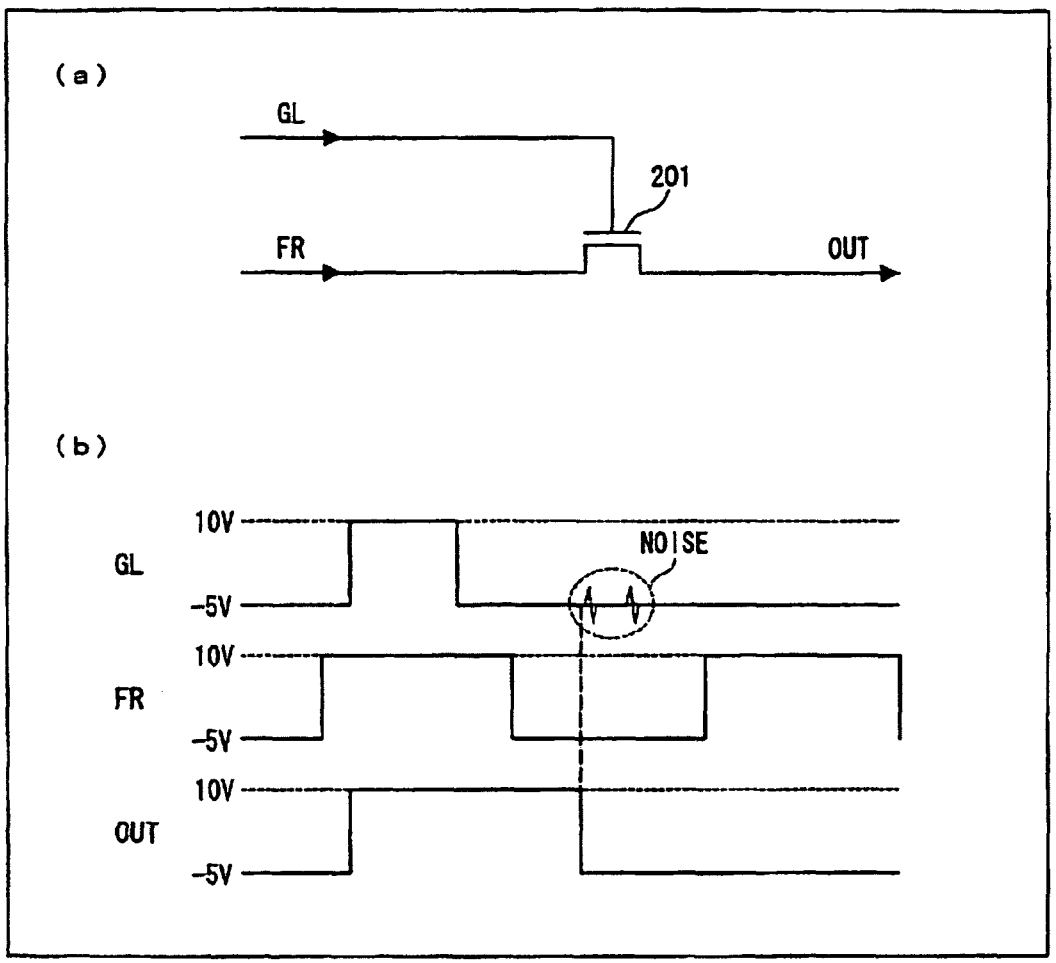
FIG. 9

Next, FIG. 7 shows another configuration of the liquid crystal display device (display device) 11 in accordance with the present embodiment. The liquid crystal display device 11 includes a display section 2, a source driver 5, and a driver 13. The display section 2 and the source driver 5 have the same configuration as those included in the liquid crystal display device 1. The driver 13 is configured to include a plurality of stages 14 . . . in cascade connection. Each stage includes a shift register stage 14a and a CS driver stage 14b. The shift register stage 14a has the same internal configuration as the CS driver stage 3a of the liquid crystal display device 1, and the CS driver stage 14b has the same internal configuration as the CS driver stage 4a of the liquid crystal display device 1. Further, the output terminal out of the shift register stage 14a is connected to the scan signal input terminal in of the CS driver stage 14b.

In the above example, both the CS driver (storage capacitor line drive circuit) and the gate driver (scan signal line driving circuit) are formed at one end of the gate bus line GL. That is, the CS driver and the gate driver are integrally formed in an area of one side of a frame of the liquid crystal display device 11. As in the liquid crystal display device 1, in this configuration, the low-potential supply voltage VSS for generating a signal voltage of a preceding stage to an output stage in the CS driver is set higher than the low-potential supply voltage GVSS of the gate driver. This makes it possible to prevent the CS driver from malfunctioning, even if noise is imposed to the gate bus line GL and from the source bus line SL and enters into the CS driver.

The present embodiment has been described above.

In the above description of the present embodiment, all TFTs are configured to have only an n-channel-polarity. However, the present invention is not limited to this. All TFTs may be configured to have a p-channel-polarity. In such a case, by setting a high-potential supply voltage for generating a signal voltage of a preceding stage to an output stage in the CS driver higher than the high-potential supply voltage of the gate driver, it is possible to prevent the CS driver from malfunctioning even in a case where noise is imposed to the gate bus line GL and from the source bus line SL and enters inside the CS driver.

Further, in the above example, the transistors are configured as TFTs formed on the glass substrate. However, the present invention is not limited to this. The transistors may be configured by using only typical n-channel-polarity field effect transistors or only p-channel-polarity field effect transistors. Accordingly, each driver may be an external driver. Further, a conductivity type, i.e. a channel polarity, of the transistors should be the same at least between the gate driver and the CS driver. However, it is not necessary that the channel polarity of other circuits such as source driver or the like have this same polarity.

Further, in the above example, in the case where the transistors are n-channel-polarity transistors, a low-potential supply voltage for generating a signal voltage of a preceding stage to an output stage in the CS driver is set higher than the low-potential supply voltage of the gate driver. Meanwhile, in the case where the transistors are p-channel-polarity transistors, a high-potential supply voltage for generating a signal voltage of a preceding stage to an output stage in the CS driver is set lower than the high-potential supply voltage of the gate driver. However, the present invention is not limited to this. For example, in the case where the transistors are n-channel-polarity transistors, the high-potential supply voltage for generating a signal voltage of a preceding stage to an output stage in the CS driver may be set higher than the high-potential supply voltage of the gate driver. Meanwhile, in the case where the transistors are n-channel-polarity transistors, the low-potential supply voltage for generating a signal voltage of a preceding stage to an output stage in the CS driver may be set lower than the low-potential supply voltage of the gate driver. In other words, in order that the transistors may distinguish between logical High and logical Low with noise imposed on and operate, at least one of the high-potential supply voltage and the low-potential supply voltage for generating a signal voltage of a preceding stage to an output stage in the CS driver should be different from that of the gate driver.

Figure 10:
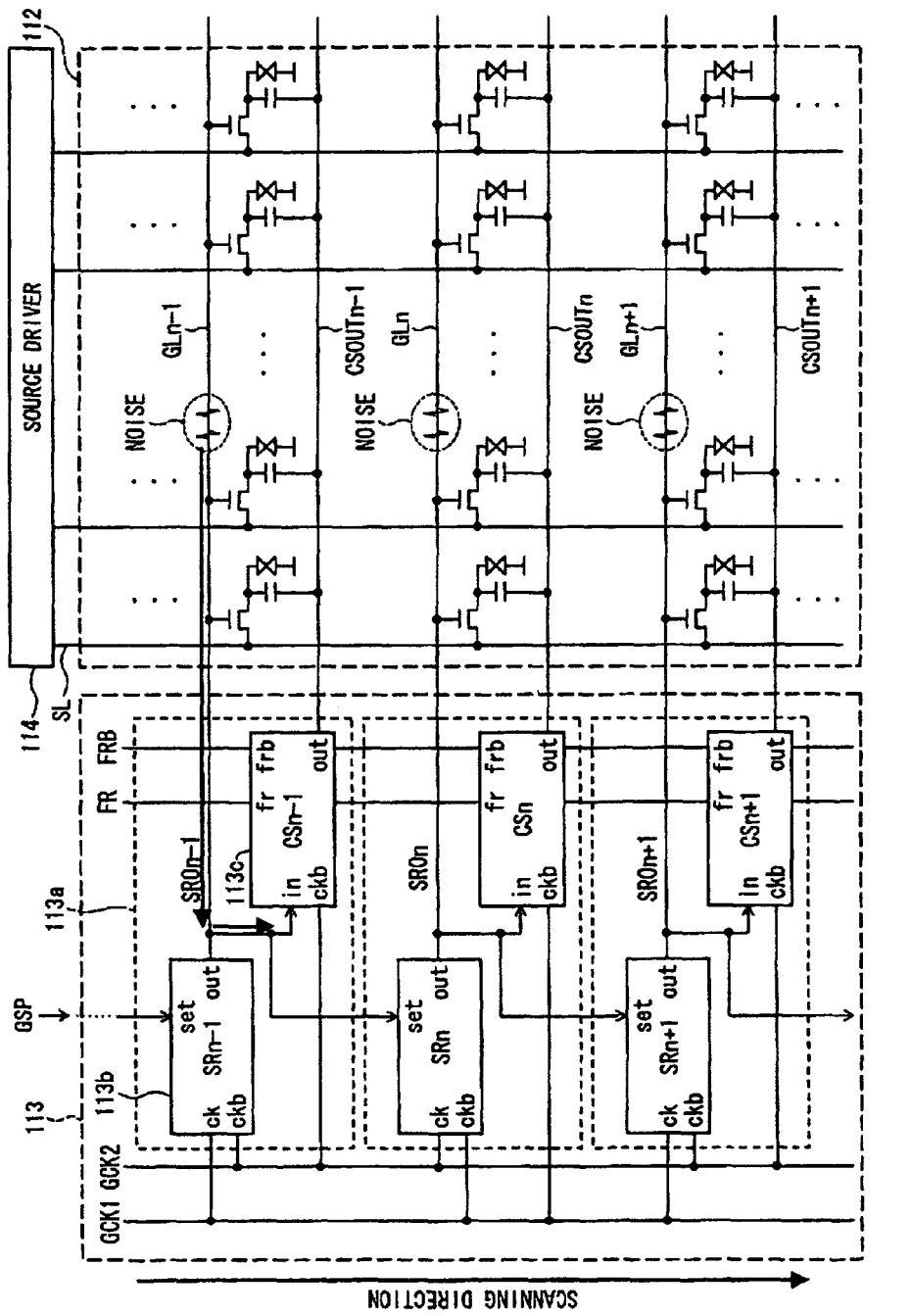
FIG. 10
Figure 11:
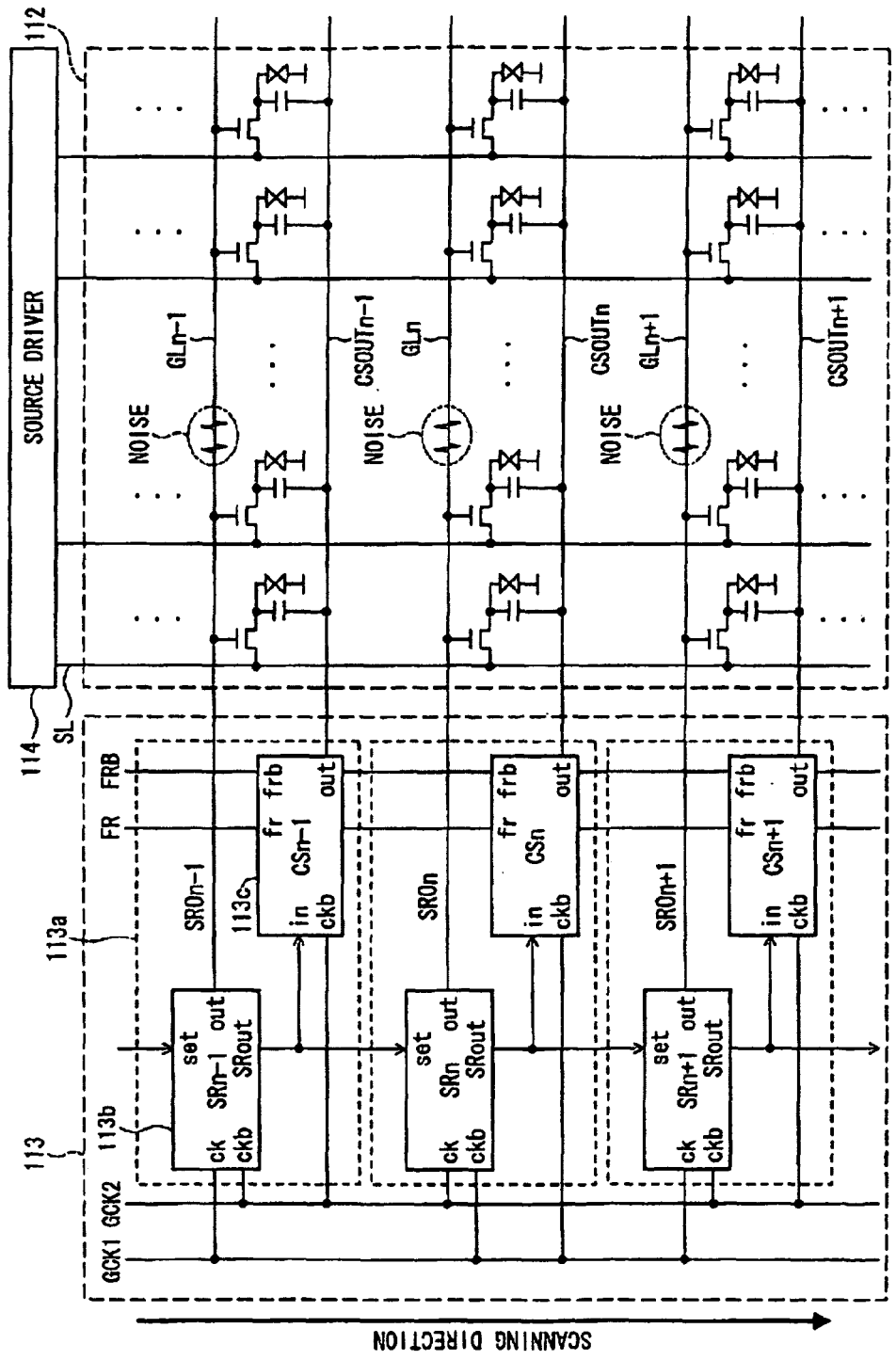
FIG. 11
Figure 12:
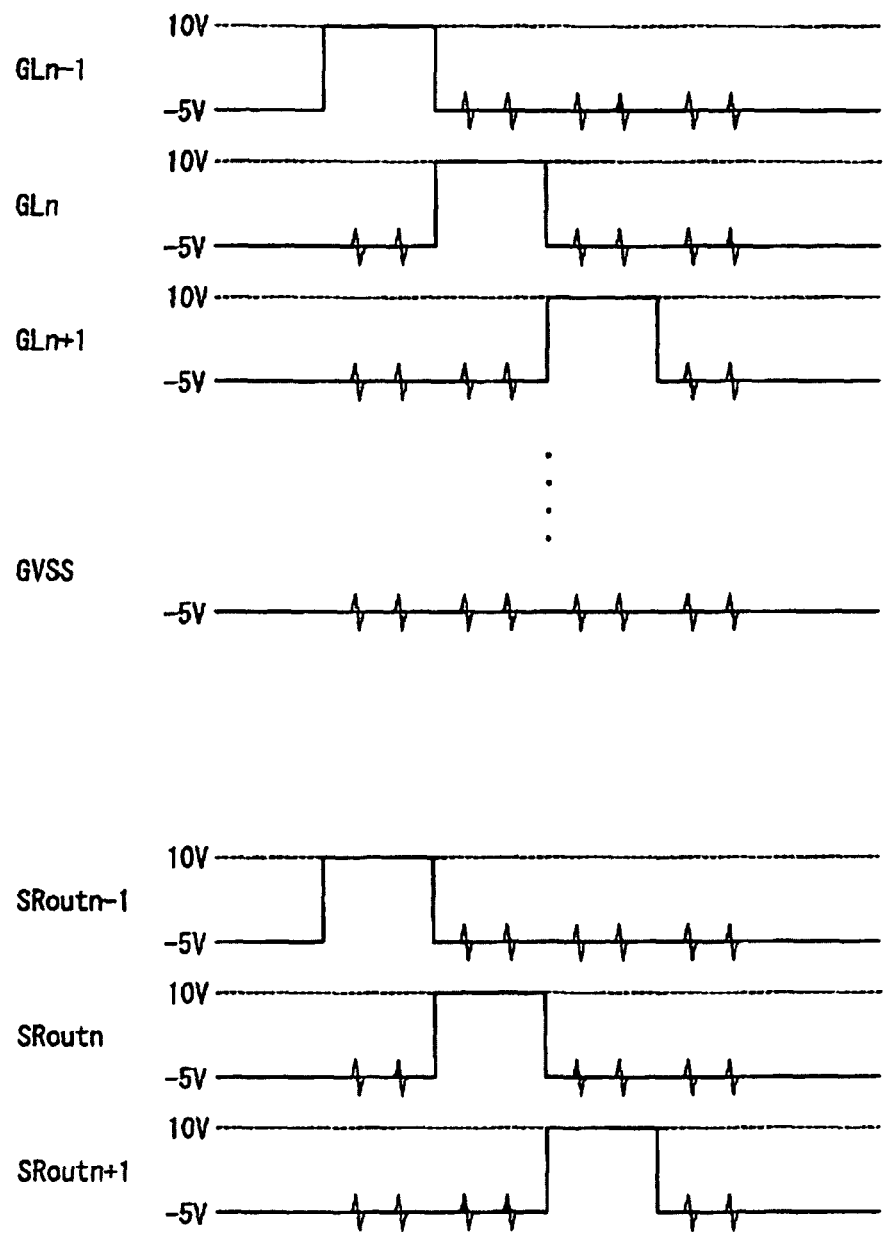
FIG. 12
Figure 13:
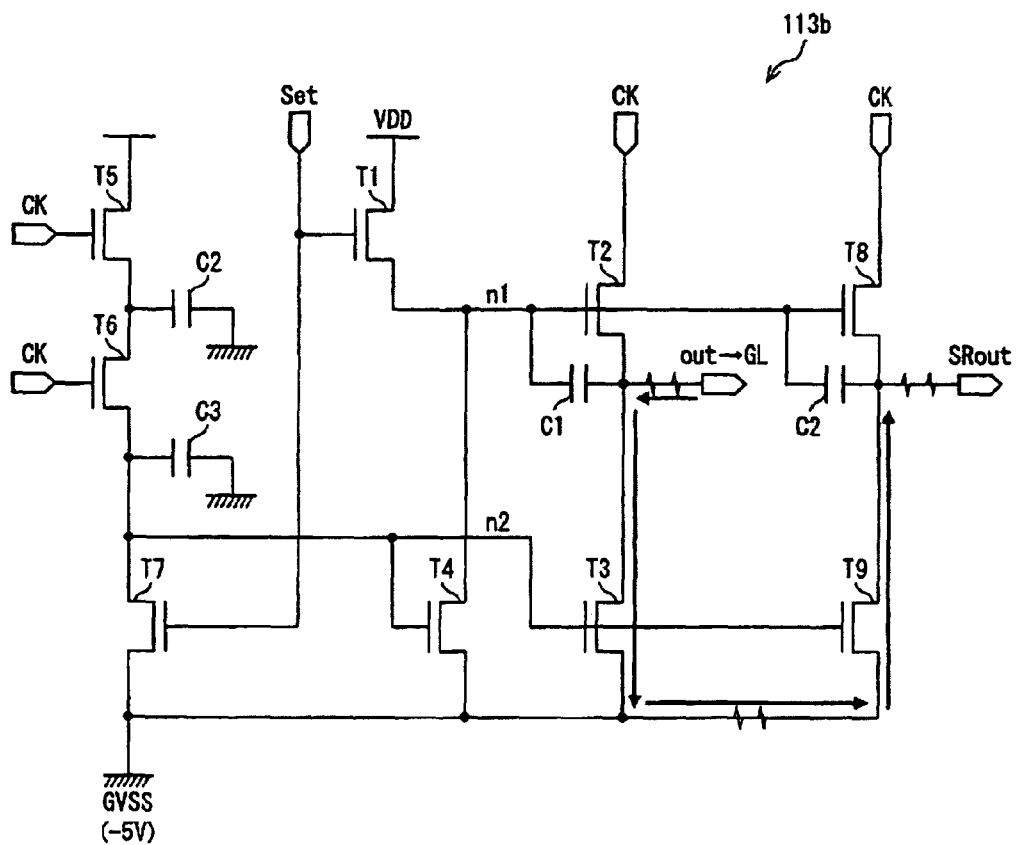
FIG. 13
Figure 14:
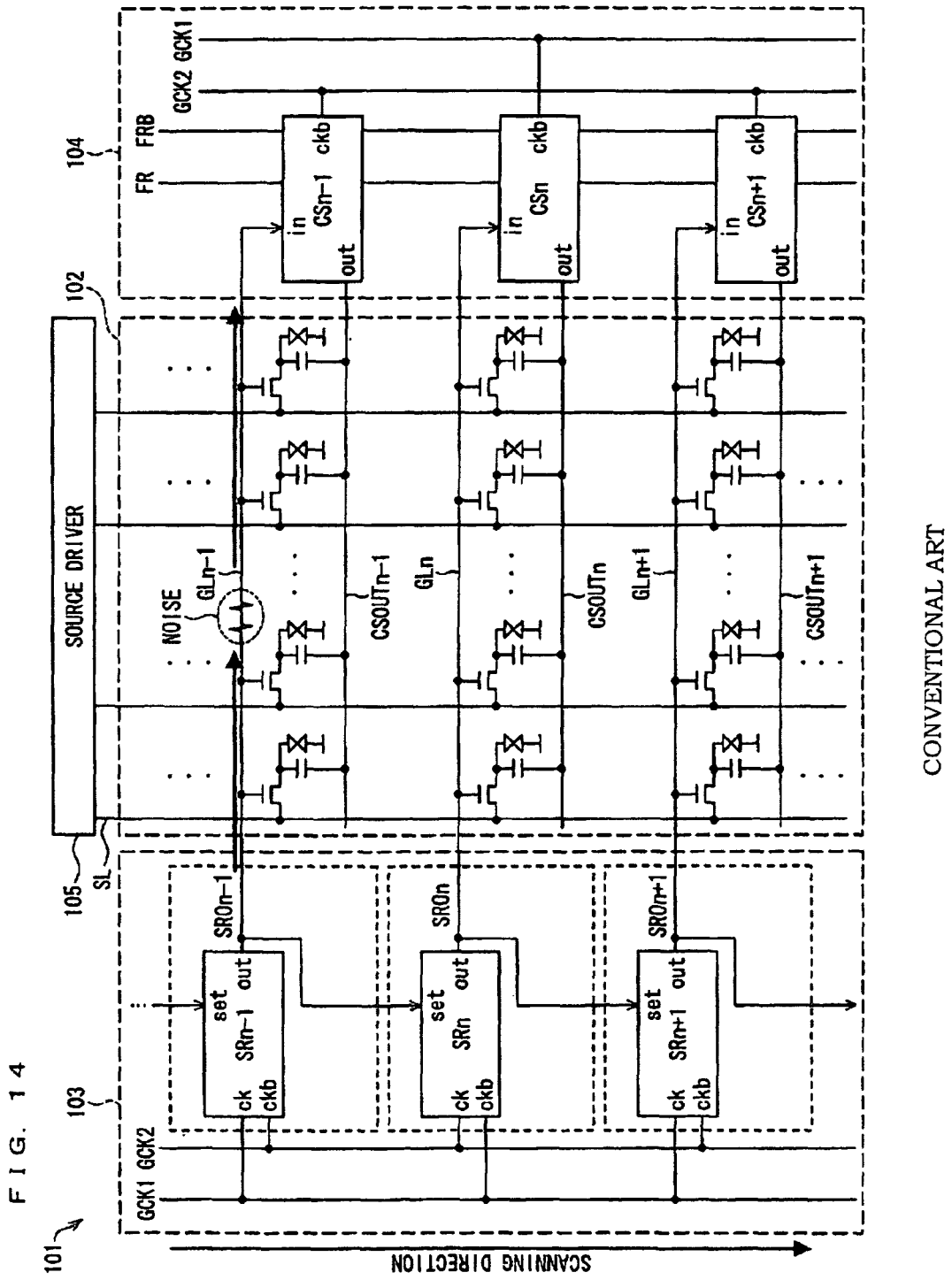
FIG. 14
Figure 15:
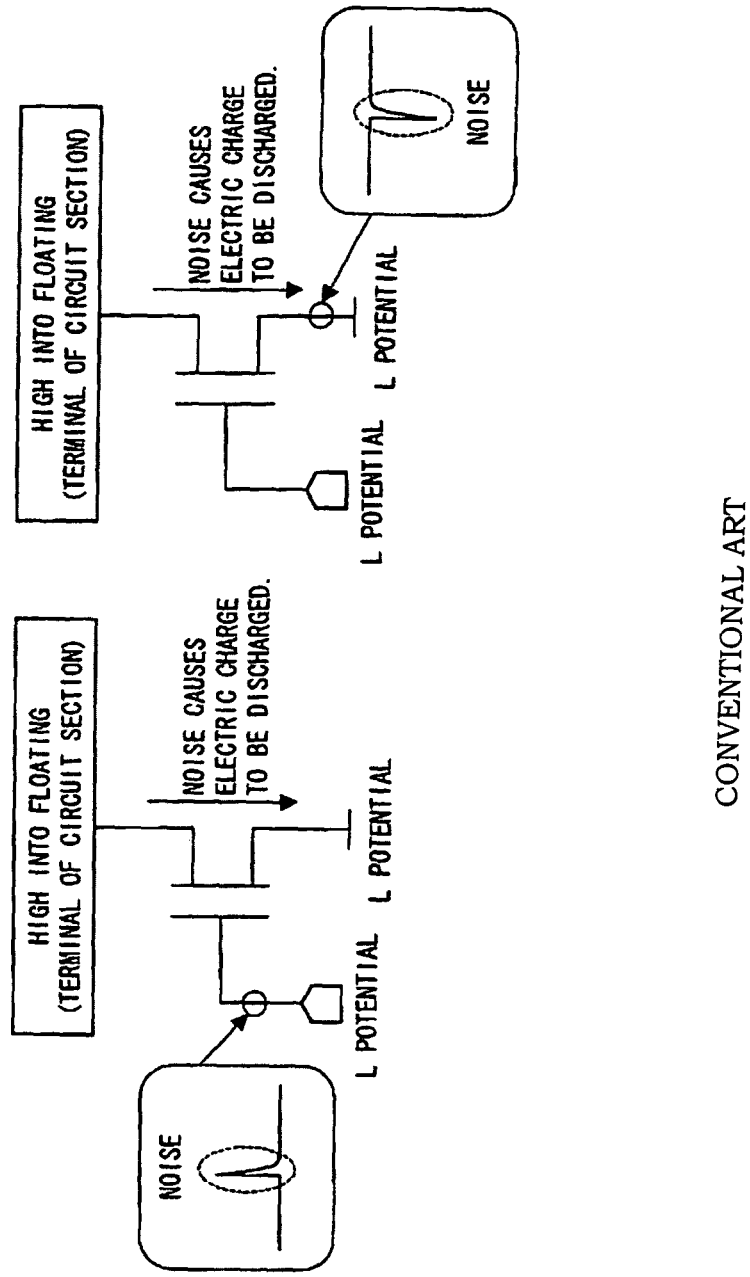
FIG. 15

Further, even in the case where, as shown in FIGS. 10 and 11, the gate driver and the CS driver are formed at one end of the pixel section, it is possible to prevent the CS driver from malfunctioning by causing at least one of the high-potential supply voltage and the low-potential supply voltage for generating a signal voltage of a preceding stage to an output stage in the CS driver to be different from that of the gate driver.

Accordingly, an output used by the CS driver from the scan signal line driving circuit may be a signal of a scan signal line as shown in FIGS. 6, 7 and 10, or the output may be, as shown in FIG. 11, a set signal outputted to another stage (a next stage in FIG. 11) by each stage including the shift register stage of the scan signal line driving circuit.

Further, the present invention is a storage capacitor line drive circuit; however, the present invention is similarly applicable to a common line drive circuit in the case of an IPS drive.

The present invention is not limited to the above-described embodiments, and various modifications are possible within the scope of the following claims. In other words, embodiments obtained by combining technical means as appropriate within the scope of the following claims are also included within the technical scope of the present invention.

As described above, in the storage capacitor line drive circuit in accordance with the present invention, at least one of the high-potential supply voltage and the low-potential supply voltage for generating a signal voltage of a preceding stage to an output stage differs from the supply voltage of the scanning signal line drive circuit.

This makes it possible to achieve a storage capacitor drive circuit capable of avoiding malfunctioning even in a case where the storage capacitor drive circuit receives noise from a scan signal line.

The detailed explanations of the invention which were given above in connection with concrete embodiments and examples are merely intended to clarify the technical contents of the present invention. Such concrete examples should not be interpreted in a restrictive sense only, and various modifications can be exercised within the spirit of the invention and the scope of the following claims.

INDUSTRIAL APPLICABILITY

The present invention can be suitably used particularly for a liquid crystal display device.

The invention claimed is:

1. A storage capacitor line drive circuit driving a storage capacitor line of an active-matrix display device operatively connected to and driven by outputs of a scanning signal line drive circuit, the storage capacitor line drive circuit comprising as transistors a plurality of transistors having an identical conductivity type, and
comprising stages corresponding to each of the outputs of the scanning signal line drive circuit,
each of the stages including a first switch, a first memory circuit, a first transfer switch, a first analog switch, a second switch, a second memory circuit, a second transfer switch, and a second analog switch,
the first analog switch and the second analog switch being included in an output stage,
the first switch being provided between the first memory circuit and an input terminal for a first polarity determination signal instructing a polarity of a storage capacitor voltage, the first switch turning on and off according to one of the outputs as a control signal, the one of the outputs being from the scanning signal line drive circuit corresponding to one of the stage,
the first memory circuit storing the first polarity determination signal taken in through the first switch and outputting as a first stored signal the first polarity determination signal,
the first transfer switch transferring as a first transferred signal the first stored signal outputted from the first memory circuit, in accordance with a timing of a clock signal inputted;
the first analog switch being provided between an output terminal to the storage capacitor line of the one of the stages and a high-potential supply of the storage capacitor voltage, the first analog switch turning on and off according to the first transferred signal as a control signal, the first transferred signal being transferred from the first transfer switch,
the second switch being provided between the second memory circuit and an input terminal for a second polarity determination signal having a polarity opposite to that of the first polarity determination signal instructing the polarity of the storage capacitor voltage, the second switch turning on and off according to the one of the outputs as a control signal, the one of the outputs being from the scanning signal line drive circuit corresponding to the one of the stage,
the second memory circuit storing the second polarity determination signal taken in through the second switch and outputting as a second stored signal the second polarity determination signal,
the second transfer switch transferring as a second transferred signal the second stored signal outputted from the second memory circuit, in accordance with the timing of the clock signal inputted,
the second analog switch being provided between the output terminal of the one of the stages and a low-potential supply of the storage capacitor voltage, the second analog switch turning on and off according to the second transferred signal as a control signal, the second transferred signal being transferred from the second transfer switch,
each of the first polarity determination signal, the first stored signal, the first transferred signal, the second polarity determination signal, the second stored signal and the second transferred signal having a high-potential supply voltage and a low-potential supply voltage, wherein:
at least one of the high-potential supply voltage and the low-potential voltage differs from a supply voltage of a corresponding logical level of the scanning signal line drive circuit.

2. The storage capacitor line drive circuit according to claim 1, wherein all the transistors are n-channel-polarity transistors.

3. The storage capacitor line drive circuit according to claim 2, wherein the low-potential supply voltage of the storage capacitor line drive circuit is higher than a low-potential supply voltage for generating the outputs of the scanning signal line drive circuit.

4. The storage capacitor line drive circuit according to claim 1, wherein all the transistors are p-channel-polarity transistors.

5. The storage capacitor line drive circuit according to claim 4, wherein the high-potential supply voltage of the storage capacitor line drive circuit is lower than a high-potential supply voltage for generating the outputs of the scanning signal line drive circuit.

6. The storage capacitor line drive circuit according to claim 1, wherein the first switch and the second switch are transistors.

7. The storage capacitor line drive circuit according to claim 1, wherein:
   the first memory circuit is a capacitor connected between (i) an output terminal of the first switch and an input terminal of the first transfer switch on one side and (ii) a low-potential supply of the first stored signal on the other side; and
   the second memory circuit is a capacitor connected between (i) an output terminal of the second switch and an input terminal of the second transfer switch on one side and (ii) a low-potential supply of the second stored signal on the other side.

8. The storage capacitor line drive circuit according to claim 1, wherein the first transfer switch and the second transfer switch are transistors turning on and off according to the clock signal as a control signal.

9. A display device comprising the storage capacitor line drive circuit according to claim 1.

10. The display device according to claim 9, wherein the storage capacitor line drive circuit and a scanning signal line drive circuit are formed so as to sandwich a scanning signal line and be separated from each other.

11. The display device in accordance with claim 9, wherein both the storage capacitor line drive circuit and a scanning signal drive circuit are formed at one end of a scanning signal line.

\* \* \* \* \*